United States Patent [19]
Zhou

[11] Patent Number: 5,999,048
[45] Date of Patent: Dec. 7, 1999

[54] METHOD AND APPARATUS FOR SPREAD SPECTRUM PILOT EXTRACTION FOR RF AMPLIFIERS

[75] Inventor: William Wei Zhou, Randolph, N.J.

[73] Assignee: Lucent Technologies Inc., Murray Hill, N.J.

[21] Appl. No.: 09/006,539

[22] Filed: Jan. 13, 1998

[51] Int. Cl.[6] .............................. H03F 1/00; H03F 3/66
[52] U.S. Cl. .............................................. 330/151; 330/52
[58] Field of Search .............................. 330/151, 52, 149, 330/2

[56] References Cited

U.S. PATENT DOCUMENTS

| | | | |
|---|---|---|---|
| 5,166,634 | 11/1992 | Narahasi et al. | 330/151 |
| 5,193,224 | 3/1993 | McNicol et al. | 330/149 |
| 5,386,198 | 1/1995 | Ripstrand et al. | 330/52 |
| 5,515,000 | 5/1996 | Maruyama et al. | 330/52 |

Primary Examiner—Robert Pascal
Assistant Examiner—Patricia Nguyen
Attorney, Agent, or Firm—Julio Garceran

[57] ABSTRACT

A spread spectrum (SS) pilot extraction system clips the RF carriers before the SS pilot is de-spread and the RF carriers are spread. The clipping of the RF carriers raises the noise level in the spectrum. However, the small increase in the in-band noise level is more than offset by the reduction of the in-band RF noise from spreading the clipped carriers. As a result, the reduction in the in-band noise from spreading the clipped carriers expands the detection range of the de-spread pilot. In doing so, the control circuitry can achieve further cancellation of the pilot and the IMD components. Thus, the SS pilot extraction system for feed forward RF amplifiers improves the spread spectrum pilot extraction and detection at the final output coupler to achieve improved pilot and IMD cancellation.

8 Claims, 6 Drawing Sheets

FIG. 2H
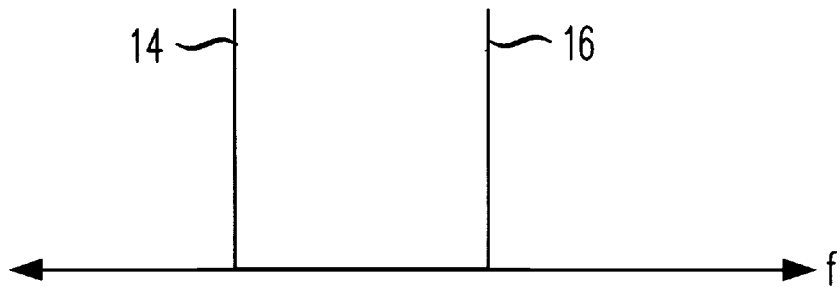
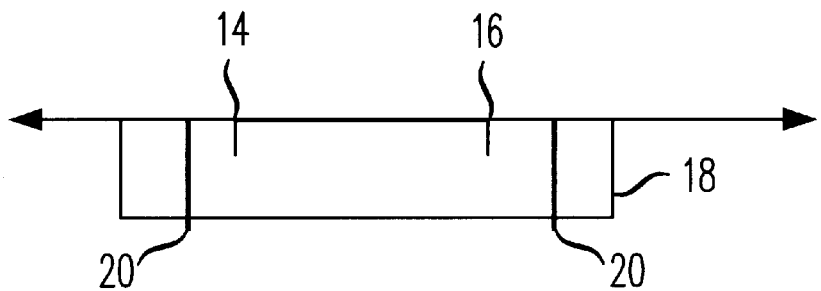
FIG. 2i
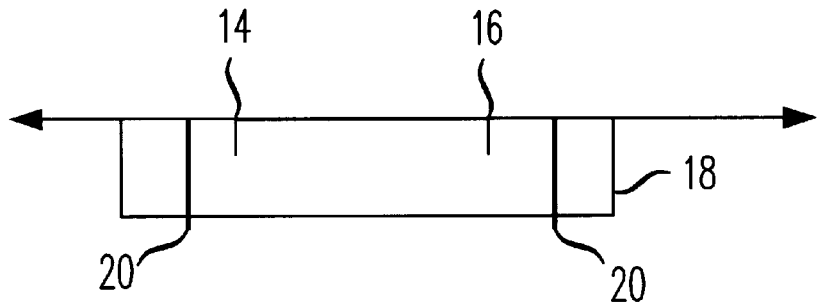
FIG. 2J

5,999,048

METHOD AND APPARATUS FOR SPREAD SPECTRUM PILOT EXTRACTION FOR RF AMPLIFIERS

BACKGROUND OF THE INVENTION

1. Field of the Invention

This invention relates to RF amplifiers and, more particularly, to a spread spectrum pilot signal extraction scheme for feed-forward RF amplifiers.

2. Description of Related Art

Feed-forward correction is routinely deployed in modem amplifiers to improve amplifier linearity with various input patterns. The essence of the feed-forward correction is to manipulate intermodulation (IMD) components created by the amplifier so that at the final summing point, the IMD components from the correction path cancel out the IMD components of the RF signal on the main path. Due to the unpredictability of input RF carrier pattern as well as the resultant IMD component location, a known frequency component, i.e. the pilot, is injected in the main loop to mimic the IMD components produced by the amplification process. By designing control circuitry to detect and cancel the pilot, the IMD components can also be removed. A common feed-forward correction scheme attempts to remove the IMD components by injecting a continuous wave (CW) frequency pilot into the RF signal. The CW pilot feed-forward correction scheme, however, requires a relatively sophisticated algorithm to constantly search for a relatively quiet location in the spectrum to place the pilot. The scheme also requires an accurate, synchronous power detector to determine the power of the pilot at the output coupler. The amplitude of the pilot at the output should not be higher than any of the IMD components. Otherwise, the pilot stands out as an unwanted distortion product like the rest of the IMD components. Consequently, the dynamic range of this scheme is limited because if the level of the CW pilot is too high, it interferes with the carriers.

Spreading a CW frequency pilot to produce a spread spectrum (SS) pilot simplifies the cancellation control circuitry and extends the pilot cancellation dynamic range. The spread spectrum pilot is spread over a wider bandwidth than the CW pilot, thereby reducing the average amplitude of the pilot at any single frequency within the wider bandwidth. When the power level of the SS pilot needs to be detected after being coupled off the output path, the SS pilot can be de-spread to extract the original CW frequency pilot. As such, the pilot is easier to detect because the SS pilot is de-spread and thereby has a much higher amplitude than the surrounding carriers and IMD components which were spread out during the despreading of the SS pilot. As such, IMD cancellation is enhanced because the pilot level can be more accurately monitored over a wider dynamic range. Because the SS pilot is spread over a wide band, there is no requirement for precise tuning to a "quiet" place in the spectrum. One drawback of the conventional spread spectrum pilot recovery scheme is that while the pilot gets de-spread, the rest of the frequency spectrum, such as the RF carriers and the IMD components, is spread, thereby raising the noise floor. The spread RF carriers (energy-rich) and the IMD components raise the noise floor which effectively reduces the detection range of the de-spread pilot.

Thus, a need exists for a pilot extraction scheme which reduces the drawbacks associated with current schemes.

SUMMARY OF THE INVENTION

The present invention involves a spread spectrum (SS) pilot extraction system which clips the RF carriers before the SS pilot is de-spread and the carriers are spread. The clipping of the RF carriers raises the noise level in the spectrum. However, this small increase in the in-band noise level from clipping the RF carriers is more than offset by the reduction of the in-band RF noise from spreading the carriers after clipping. As a result, the reduction in the in-band noise from spreading the carriers after clipping expands the detection range of the de-spread pilot. In doing so, the control circuitry can achieve further cancellation of the pilot and the IMD components. Thus, the SS pilot extraction system for feed forward RF amplifiers improves the spread spectrum pilot extraction and detection at the final output coupler to achieve improved pilot and IMD cancellation.

BRIEF DESCRIPTION OF THE DRAWINGS

Other aspects and advantages of the present invention may become apparent upon reading the following detailed description and upon reference to the drawings in which.

DETAILED DESCRIPTION

Illustrative embodiments of the SS pilot extraction system for use in feed-forward RF amplifiers according to the principles of the present invention are described below as the system might be implemented to provide enhanced cancellation of IMD components. The SS pilot extraction system attempts to enhance pilot cancellation and thereby improve IMD cancellation. To improve cancellation of the pilot, the pilot extraction system according to the principles of the present invention improves pilot detection. The SS pilot extraction system enables accurate detection of the pilot by using an SS pilot extraction circuitry which clips at least one carrier of the coupled RF signal, then spreads the at least one clipped carrier and despreads the pilot. Spreading the carrier(s) distributes the majority of the energy of the carrier(s) over a particular band, for example, 20 MHz. Although the clipping of the RF carriers generates wide band (for example, much greater than 20 MHz) RF noise in the spectrum, this small increase in the in-band noise level due to the clipping is much less than the in-band RF noise caused by spreading energy-rich, un-clipped carriers. As a result, the detection range of the despread pilot is greatly expanded, which means greater cancellation of the pilot and the IMD components can be achieved. As such, because of the improved IMD cancellation, the carrier-to-IMD ratio at the output is improved. For example, if the pilot detection range is improved by 10–15 dBs, the carrier-to-IMD ratio can be improved by 10–15 dBs because of the additional 10–15 dBs of IMD cancellation provided by the SS pilot extraction system according to the principles of the present invention.

Figure 1:
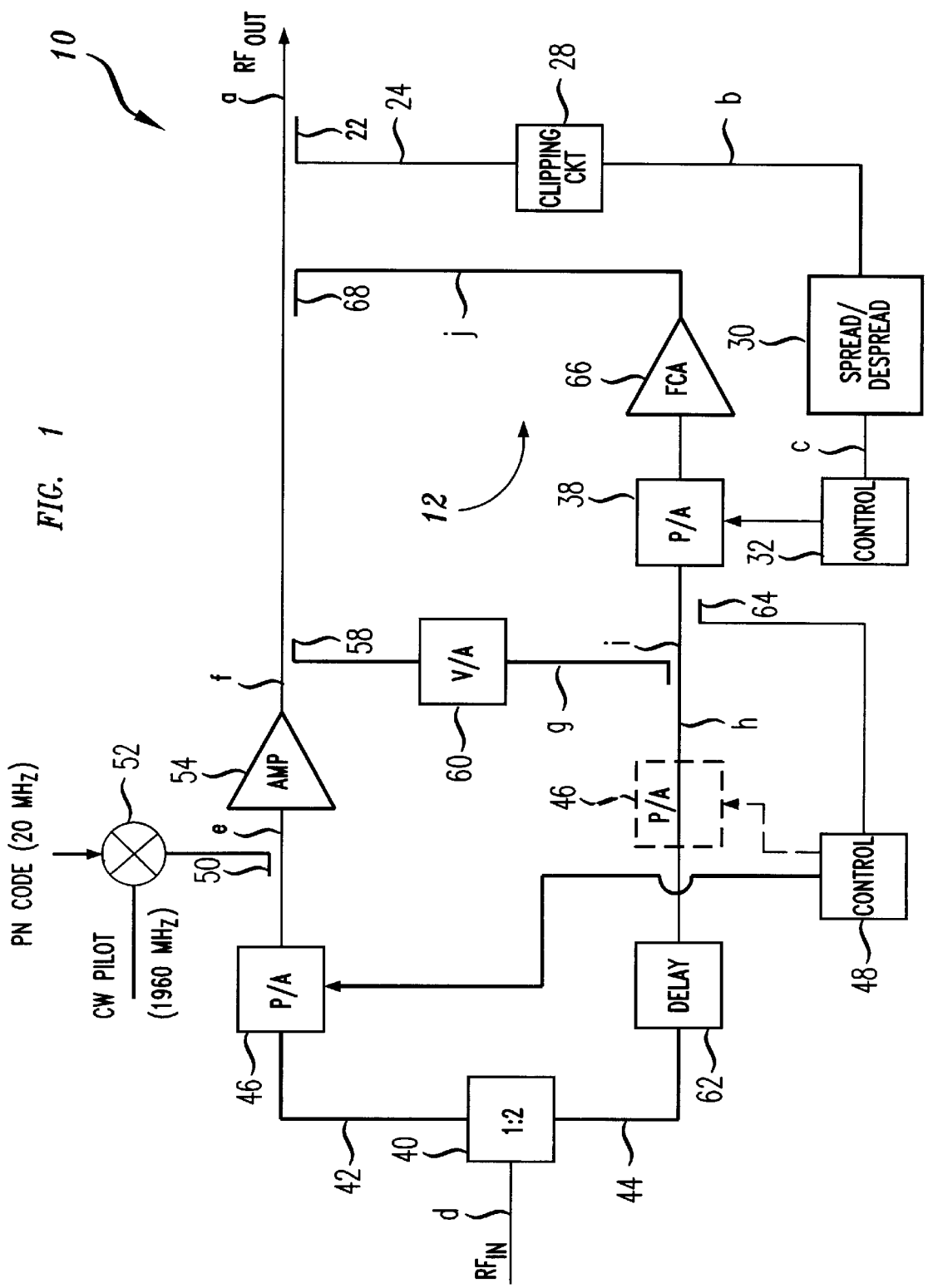
FIG. 1 shows an embodiment of an RF amplifier with a feed forward SS pilot extraction scheme according to the principles of the present invention.
Figure 2A:
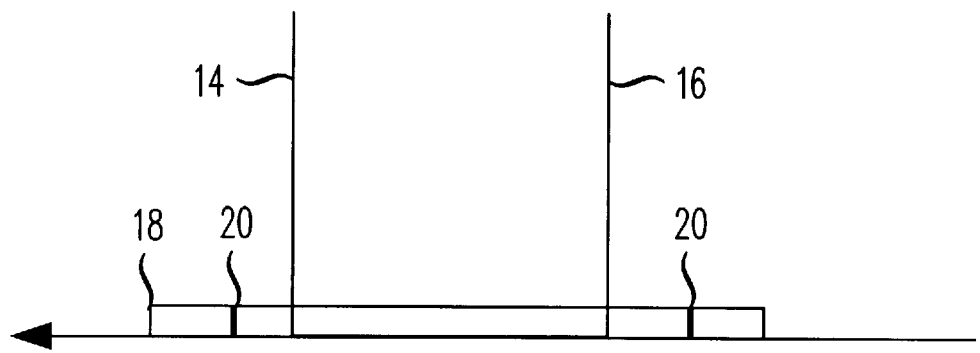
FIGS. 2a–g show examples for carrier, IMD and pilot signals at various locations in the RF amplifier scheme of FIG. 1 to illustrate the operation of the RF amplifier scheme of FIG. 1 according to the principles of the present invention.
Figure 2B:
Figure 2C:
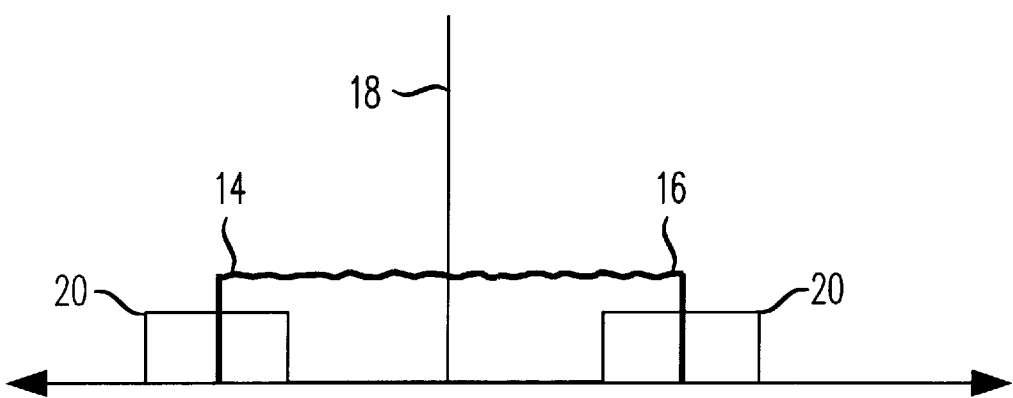
Figure 2D:
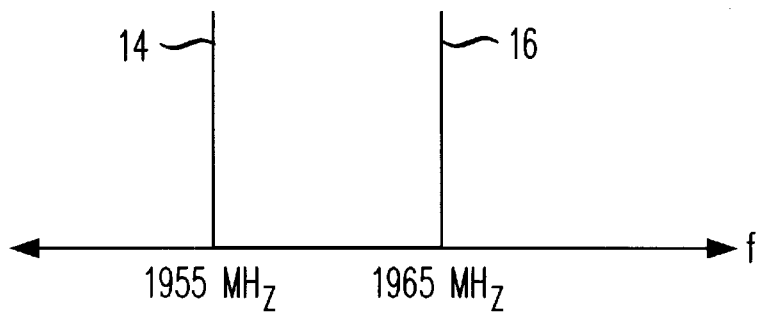
Figure 2E:
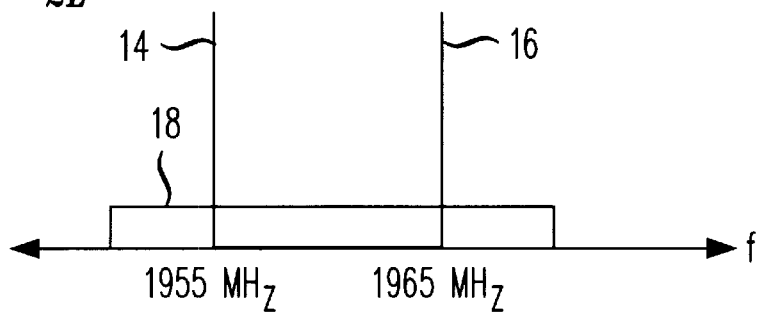

FIG. 1 shows a block diagram of an embodiment of a radio frequency (RF) amplifier arrangement 10 with a feed-forward pilot extraction loop 12 in accordance with the principles of the present invention to remove IMD components from the RF output. With particular reference to FIGS. 1 and 2a–g, the RF output signal at point a includes carriers 14 and 16 (FIG. 2a) as well as the spread spectrum pilot 18 (FIG. 2a) as and IMDs 20 (FIG. 2a). In accordance with the principles of the present invention, a coupler 22 couples the RF output signal onto the pilot extraction path 24. The coupled RF signal is provided to clipping circuitry 28. In this particular embodiment, the clipping circuitry 28 clips the carriers 14 and 16 of the coupled RF signal. By clipping the energy-rich carriers, noise is splashed across the spectrum, so the level of noise can rise on the order of 1 or 2 dB's across the spectrum as shown in FIG. 2b. The carrier-clipped signal is provided to spreader/despreader 30 which despreads the pilot 18 while spreading the clipped carriers 14 and 16 as well as the IMDs 20.

By de-spreading the pilot 18 while spreading the clipped carriers 14 and 16, the rise in noise level which would occur due to the spreading of un-clipped carriers is reduced, thereby improving the pilot detection range. For example, without clipping the carriers 14 and 16 prior to spreading the carriers, the de-spread pilot can have a typical power level of 10 dBm while the spread, un-clipped carriers raise the noise level to about 5 dBm. As such, the spread pilot is about 5 dB above the spread carriers, so the control circuitry 32 can detect about 5 dB of pilot. Clipping the carriers 14 and 16 prior to de-spreading the pilot 20 and spreading the carriers 14 and 16 and the IMDs 20 allows the control circuitry 32 to detect more of the de-spread pilot 18 for enhanced cancellation of the spread pilot 18. For example, by clipping approximately 20 dB from the carriers 14 and 16 prior to spreading the carriers 14 and 16, the power level of the de-spread pilot 18 (FIG. 2c) is still 10 dBm while the clipped, spread carriers 14 and 16 (FIG. 2c) produce a noise level at about −5 dBm. Thus, by clipping the carriers 14 and 16, the pilot detection range improves to 15 dB compared to 5 dB.

The control circuitry 32 detects the de-spread pilot 18 at point c and provides control signals to a phase and attenuation adjuster (P/A) 38 to reduce the de-spread pilot 18 at point c. Reducing the de-spread pilot 18 at point c indicates that the cancellation of the spread pilot 18 at point a has increased. Because the SS pilot 18 is designed to mimic the IMD components 20, the improved cancellation of the SS pilot 18 leads to an improvement in the cancellation of the IMDs 20 at point a. In certain embodiments, the power level of the SS pilot 18 is adjusted according to the power level of the RF output signal to follow the IMD components 20. The level of the IMD components 20 for a given RF output signal can be predicted by knowing the specific operating characteristics for the particular amplifier 54. As such, the SS pilot can more accurately mimic the IMD components. Alternatively, the power level of the SS pilot 18 can be adjusted to mimic worst-case IMD components.

Embodiments of the SS pilot extraction system 12 are used with the feed forward RF amplifier arrangement 10 shown in FIG. 1. For example, an RF input signal, including the adjacent RF carriers 14 and 16 (FIG. 2d) centered at 1955 MHz and 1965 MHz respectively, is provided to a signal coupler 40. In this particular embodiment, the signal coupler 40 is a 1:2 splitter. The coupler 40 splits the RF signal onto two paths 42 and 44. The RF signal on path 42 is provided to the phase/attenuation adjustor (P/A) 46 which changes the phase and power level of the RF signal according to control signals from control circuitry 48. Alternatively, the phase/attenuation adjuster (P/A) 46 can be located on the lower path 44 to adjust the phase and power level of the RF signal on the lower path 44. By placing the P/A 46 on the upper path 42, the P/A 46 can actively maintain the gain on the upper path 42. Embodiments are possible which put a P/A on both paths 42 and 44.

At point e, a coupler 50 adds the spread spectrum pilot 18 (FIG. 2e) to the RF signal. The SS pilot is generated using mixer 52 to mix a CW pilot (centered at for example 1960 MHz) with a pseudo-random noise (PN) code (having a 20 MHz frequency). As such, in this particular example, the SS pilot is centered at 1960 MHz with a 20 MHz bandwidth. In this particular embodiment, the spreader/despreader 30 on the SS pilot extraction path 24 includes a mixer which receives the RF signal and a PN code which is delayed to match the PN code received by the mixer 52. The delay roughly corresponds to how long the RF signal takes to travel from points e to f to a to b. The resulting RF signal from the mixer 52 with carriers 14 and 16 and the SS pilot 30 is provided to an RF amplifier 54.

Figure 2F:
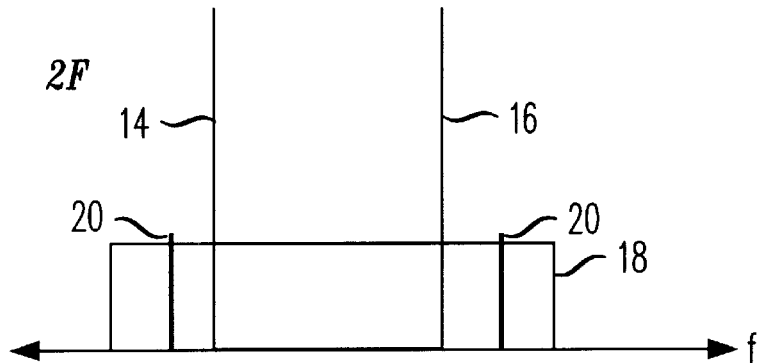
Figure 2G:
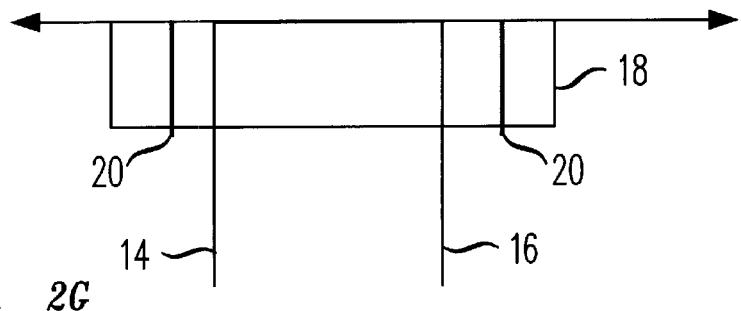

The RF amplifier 54 amplifies the carriers 14 and 16 and the SS pilot 18 as well as producing the IMD components 20 at point f (FIG. 2f). In this particular embodiment, a coupler 58 provides a coupled RF signal to a variable attenuator 60. The variable attenuator 60 adjusts the amplitude of the coupled signal to match the amplitude of the RF signal on the lower path 44. In this particular embodiment at point g, the carriers 14 and 16 of the coupled signal (FIG. 2g) have been adjusted to match the amplitude of the carriers 14 and 16 at point h (FIG. 2h) and to be 180 degrees out of phase with the carriers 14 and 16 at point h (FIG. 2h). As such, after any appropriate delay 62 so that the RF signals arrive at point i at the same time and 180 degrees out of phase, the carriers 14 and 16 are canceled out at point i yielding the waveform of FIG. 2i.

A coupler 64 provides the waveform of FIG. 2i to the control circuitry 48. The control circuitry 48 monitors the waveform and provides control signals to the P/A 46 in an attempt to improve the cancellation of the carriers 14 and 16 at point i. The RF signal with the canceled carriers 14 and 16 (FIG. 2i) is provided to the P/A 38. The P/A 38 adjusts the phase and attenuation of the carrier-less RF signal at point i according to control signals from the control circuitry 32 to improve pilot cancellation. The adjusted RF signal is provided to a final correction amplifier (FCA) 66 which amplifies the adjusted RF signal. The RF signal at point j (FIG. 2j) is coupled onto the upper path 42 by coupler 68 to cancel the SS pilot 18 and the IMD's 20, thereby producing the RF output at point a (FIG. 2a).

Figure 3:
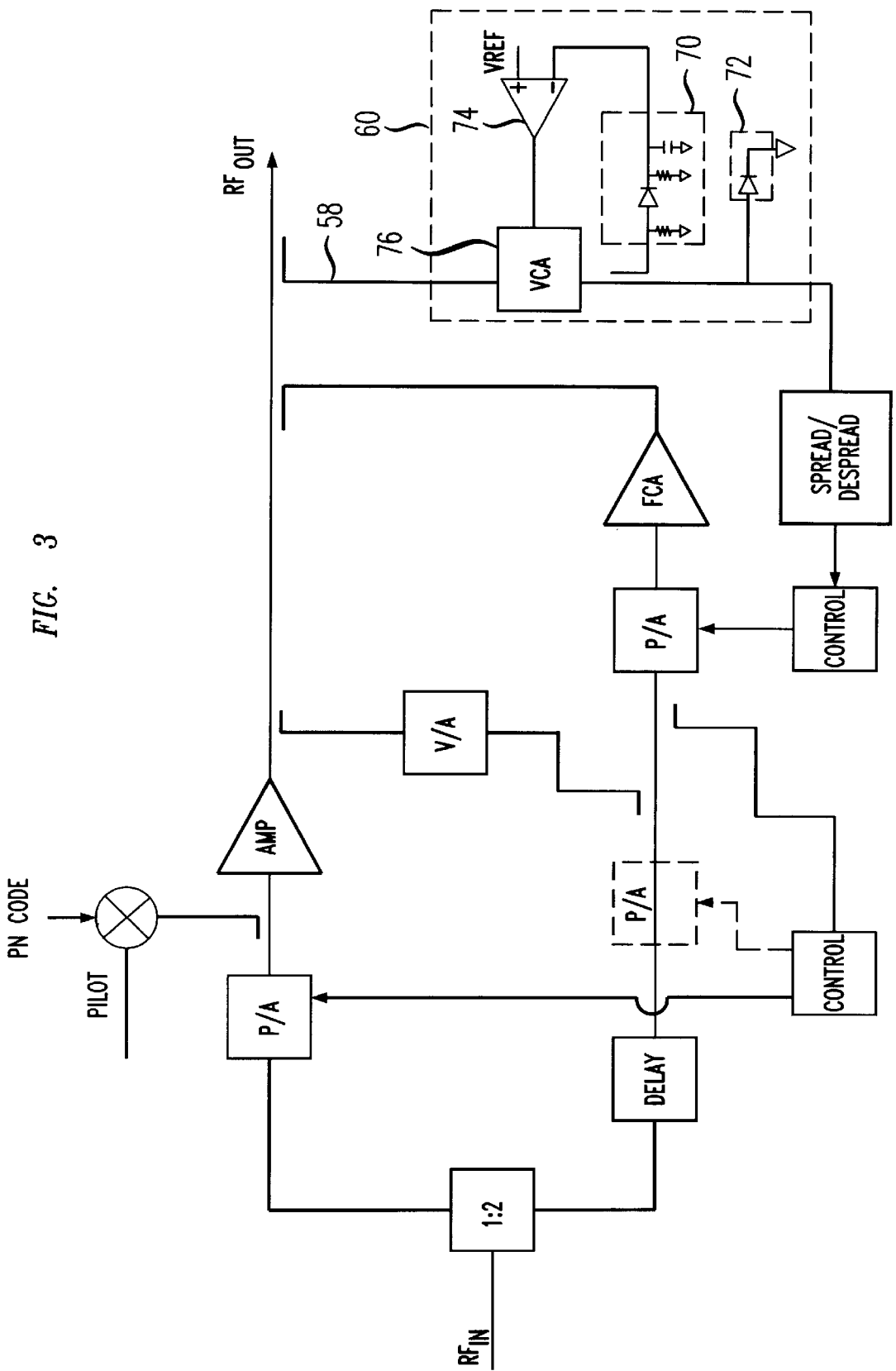
FIG. 3 shows a block diagram of an embodiment of the RF amplifier with a feed forward pilot extraction scheme according to the principles of the present invention.

In particular embodiments of the clipping circuitry 60, the clipping circuitry 60 clips the same percentage of the carrier power at any output power level. For example, the clipping circuitry 60 can clip a constant 20 dB from the carrier power level. FIG. 3 shows a particular embodiment of the clipping circuitry 60 shown in the feed forward RF amplifier arrangement of FIG. 1. In this embodiment, the clipping circuitry 60 is in the form of an automatic gain control circuitry which holds the carrier power level before the clipping circuitry 60 relatively constant regardless of the output power level. An RF detector circuit 70 detects the RF energy level going into a clipping circuit 72. An error amplifier 74 compares the output from the detector circuit 70 with a constant reference voltage $V_{ref}$. The output of the error amplifier 74 continuously adjusts a voltage-controlled attenuator (VCA) 76 to maintain a constant detection voltage at the output of the RF detector circuit 70 that matches the reference voltage $V_{ref}$, thereby ensuring a constant power into the clipping circuitry 60. As such, the carrier-dominant spectrum signal entering the clipping circuit 72 at any given output power level will have the same carrier power level. Maintaining the carrier power level enables the use of a single diode with a specified diode conduction voltage as the clipping circuit 72. Other arrangements are possible for the clipping circuit 72 as well as for the entire clipping circuitry 60.

Figure 4:
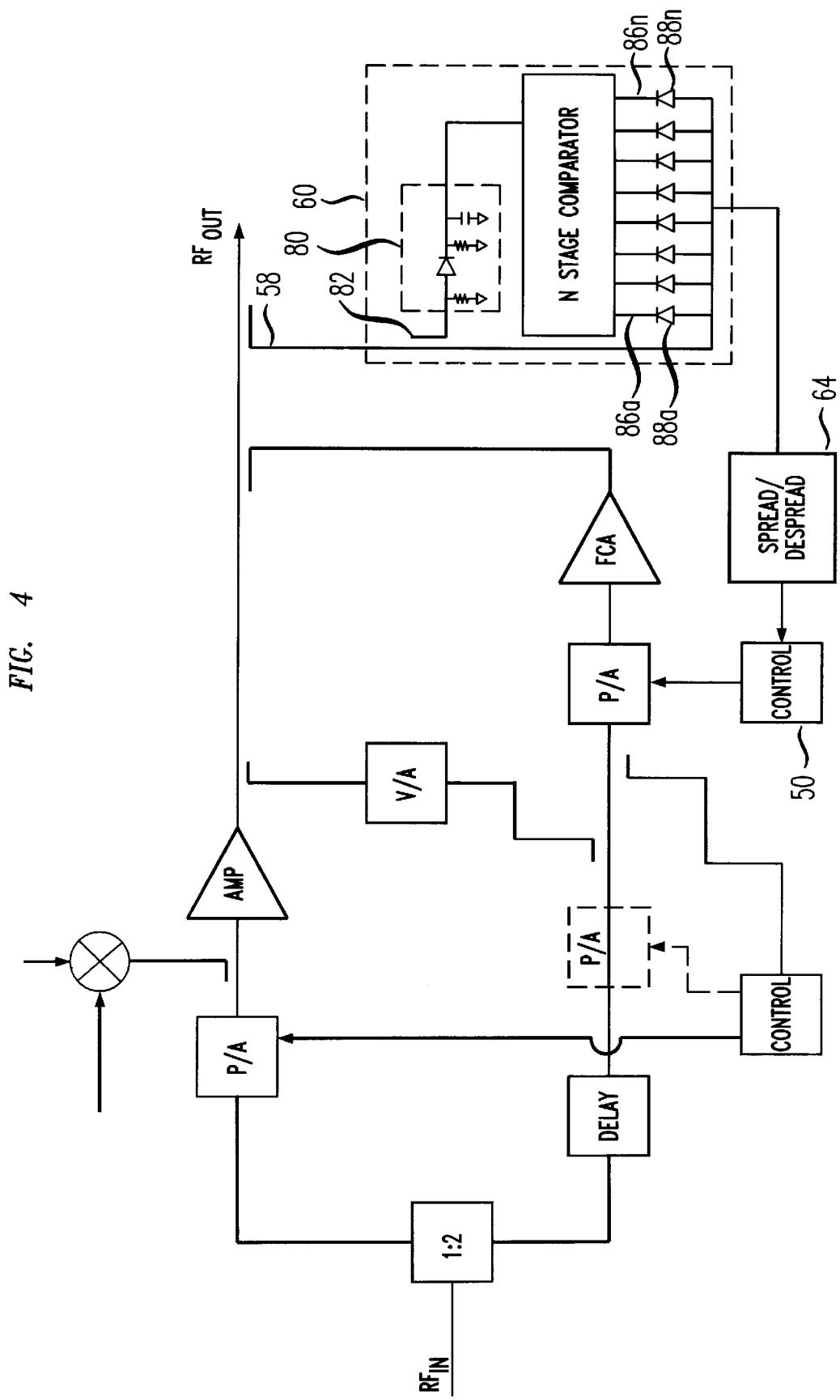
FIG. 4 shows a block diagram of another embodiment of the RF amplifier with a feed forward pilot extraction scheme according to the principles of the present invention

While the above approach adjusts the power level of the coupled signal to maintain the power level and to provide a relatively constant percentage of clipping, another approach clips depending upon the changing power level. For example, FIG. 4 shows another embodiment of the clipping circuitry 60 for the SS pilot extraction system 12 (FIG. 1) according to the principles of the present invention. An RF detector circuit 80 detects the power of the signal coupled from the pilot extraction path 58 using coupler 82. The DC voltage is fed to an N-stage comparator circuit 84 which shorts one outputs 86a–n to ground depending on the voltage from the RF detector circuit 80. The output 86a–n that gets shorted to ground cause the corresponding diode 88a–n to start conducting, thereby clipping the energy-rich carriers of the signal on the pilot extraction path 58 depending upon the power level of the coupled signal. In this particular embodiment, the clipping circuitry 60 uses multiple diodes 88a–n. Each diode 88a–n is meant to clip under a specified power range for the carrier-dominated signal on the pilot extraction path 58. Each diode 88a–n has a different diode conduction voltage to handle a different output power range, thereby providing a relatively constant percentage of clipping at all power levels.

In addition to the embodiments described above, alternative configurations of the SS pilot extraction system according to the principles of the present invention are possible which omit and/or add components and/or use variations or portions of the described SS pilot extraction system. For example, the clipping circuitry 60 has been described using different configurations of discrete components, but it should be understood that the SS pilot extraction system and portions thereof can be implemented in application specific integrated circuits, software-driven processing circuitry, firmware or other arrangements of discrete components as would be understood by one of ordinary skill in the art with the benefit of this disclosure. Additionally, the clipping circuitry can be designed to enable changing the percentage of clipping.

Embodiments of the SS pilot extraction system have been described with specific feed-forward RF amplifier arrangements, but the SS pilot extraction system can be used in other feed-forward RF amplifier arrangements. Additionally, the SS pilot cancellation system has been described as canceling the SS pilot from an RF signal having two carriers, but the SS pilot extraction system can operate on RF signals including at least one carrier and or greater than two carriers. Furthermore, in FIGS. 2a–g, the spread signals are shown as vertical lines and the despread signals have a rectangular shape for illustrative purposes. It should be understood that both the spread and de-spread signals would have a more Gaussian shape. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claim is:

1. A method for transmitting an RF signal having at least one carrier signal, said method comprising the steps of:

adding a spread spectrum pilot to said RF signal;

receiving at least a portion of said RF signal;

clipping said at least one carrier signal from said at least a portion of said RF signal;

spreading said at least one clipped carrier signal from said at least a portion of said RF signal;

de-spreading said spread spectrum pilot signal from said at least a portion of said RF signal; and detecting said de-spread pilot signal to produce control signals for reducing said spread spectrum pilot signal of said RF signal.

2. The method of claim 1 wherein said step of clipping further includes the steps of:

clipping a relatively constant percentage of power from said at least one carrier signal.

3. The method of claim 1 wherein said step of clipping further including the steps of:

detecting said at least one adjusted carrier signal to produce a detection signal;

adjusting said at least one carrier signal depending upon a comparison signal resulting from a reference signal and said detection signal; and clipping said at least one adjusted carrier signal.

4. The method of claim 1 wherein said step of clipping further includes the steps of:

detecting said at least one carrier signal to produce a detection signal; and clipping said at least one carrier signal depending on said detection signal.

5. An RF amplifier system which produces an RF signal, said system comprising:

spreading circuitry configured to add a spread spectrum pilot to said RF signal;

clipping circuitry configured to receive at least a portion of said RF output signal and to clip at least one carrier of said at least a portion of said RF signal;

spreading/de-spreading circuitry coupled to said clipping circuitry and configured to receive said at least a portion of said RF output signal, said spreading/de-spreading circuitry configured to spread said at least one clipped carrier and to de-spread the spread spectrum pilot of said at least a portion of said RF signal; and control circuitry configured to detect said de-spread pilot and provide control signals for reducing said spread spectrum pilot of said RF signal.

6. The system of claim 5 wherein said clipping circuitry is configured to clip a relatively constant percentage of power from said at least one carrier signal.

7. The system of claim 5 wherein said clipping circuitry configured to adjust said at least one carrier signal to a certain level and to clip said at least one adjusted carrier signal by a relatively constant percentage.

8. The system of claim 5 wherein said clipping circuitry configured to detect a level for said at least one carrier signal and to attenuate and clip said at least one carrier signal depending on said level.

* * * * *